US006507093B2

United States Patent
Kaneda et al.

(10) Patent No.: US 6,507,093 B2
(45) Date of Patent: Jan. 14, 2003

(54) LEAD FRAME FOR FABRICATING SURFACE MOUNT TYPE SEMICONDUCTOR DEVICES WITH HIGH RELIABILITY

(75) Inventors: Yoshiharu Kaneda, Tokyo (JP); Tokuhiro Uchiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/836,174

(22) Filed: Apr. 18, 2001

(65) Prior Publication Data

US 2001/0033008 A1 Oct. 25, 2001

(30) Foreign Application Priority Data

Apr. 19, 2000 (JP) ........................................ 2000-123672

(51) Int. Cl.[7] ............................................. H01L 23/495
(52) U.S. Cl. ...................................... 257/666; 438/123
(58) Field of Search ........................... 257/666; 438/123

(56) References Cited

U.S. PATENT DOCUMENTS 5,147,815 A * 9/1992 Casto .......................... 257/666
5,710,064 A * 1/1998 Song et al. ................... 257/666

FOREIGN PATENT DOCUMENTS

| JP | 62-188149 | 11/1987 |
|---|---|---|
| JP | 4-340264 | 11/1992 |
| JP | 5-283574 | 10/1993 |

* cited by examiner

Primary Examiner—Nathan J. Flynn
Assistant Examiner—Leonardo Andújar
(74) Attorney, Agent, or Firm—Foley & Lardner

(57) ABSTRACT

A lead frame and a semiconductor device fabricated by using the same. The lead frame comprises: first and second band shaped members disposed parallel to each other; a plurality of island portions for mounting semiconductor pellets thereon having first end portions connected to the first band shaped member; coupling strip each provided for one of the island portions whose first end portion connects to a second end portion of each of the island portions and whose second end portion connects to the second band shaped member. The lead frame further comprises at least one electrode portion for each of the island portions and electrically coupled with a corresponding electrode of the semiconductor pellet. The at least one electrode portion is disposed between each of the island portions and the second band shaped member, a first end portion thereof is connected to the second band shaped member, and a second end portion thereof is opposed to the second end portion of each of the island portions.

4 Claims, 8 Drawing Sheets

PRIOR ART

PRIOR ART

LEAD FRAME FOR FABRICATING SURFACE MOUNT TYPE SEMICONDUCTOR DEVICES WITH HIGH RELIABILITY

FIELD OF THE INVENTION

The present invention relates generally to a surface mount type semiconductor device and a lead frame used for fabricating the same. More particularly, the present invention relates to downsizing a surface mount type semiconductor device without deteriorating reliability thereof and to realizing a lead frame suitable for such downsizing.

BACKGROUND OF THE INVENTION

Portable type electronic circuit apparatuses such as a video camera, a notebook type personal computer and the like are being urged to be small in size and light in weight. Thus, it is strongly desired that electronic parts used in these electronic circuit apparatuses such as semiconductor devices and the like are also downsized and thinned. In order to cope with such requirements, electronic parts themselves are downsized. Alternatively, even if the external size of each of the electronic parts is the same or slightly larger than before, electronic elements therein are more highly integrated and, thereby, the electronic parts are made substantially small in size and light in weight.

FIG. 14 is a partial perspective view illustrating a conventional lead frame used for fabricating a semiconductor device. The lead frame 105 shown in FIG. 14 is used for fabricating a power semiconductor device which emits much heat when operated.

The lead frame 105 shown in FIG. 14 comprises a pair of band shaped members, that is, first and second band shaped members 101 and 102 disposed parallel to each other. The width of the first band shaped member 101 is smaller than that of the second band shaped member 102. In the second band shaped member 102, holes or perforations 102a for transferring the lead frame 105 are formed at intervals of a predetermined constant length. The lead frame 105 further comprises island portions or heat sinks 103, and leads 104. The heat sinks 103 are disposed outside the first band shaped member 101, that is, on the opposite side of the second band shaped member 102, with predetermined spaces therebetween. The leads 104 comprise lead sets each of which has mutually parallel three leads 104a, 104b and 104c. A large number of lead sets of the leads 104 extend from an edge portion of the second band shaped member 102 beyond the first band shaped member 101. Therefore, the first band shaped member 101 is coupled with the second band shaped member 102 via the leads 104. In each lead set of the leads 104, the center lead 104a is coupled, at an edge portion thereof, with an edge portion of the heat sink 103. End portions of other leads in each lead set are not coupled with the heat sink, but are located near the edge portion of the heat sink 103.

With reference to the drawings, an explanation will be made on a method of manufacturing a conventional power semiconductor device. FIG. 15 is a side cross sectional view of a conventional power semiconductor device fabricated by using the lead frame 105 shown in FIG. 14, and FIG. 16 is a top perspective view of the semiconductor device. For the sake of easy understanding, FIG. 16 shows a structure of a portion within an encapsulation resin by using perspective representation.

First, a semiconductor pellet 107 is mounted on the heat sink 103 by using a solder 106. Then, electrodes (not shown in the drawing) on the semiconductor pellet 107 and the leads 104b and 104c are electrically coupled via wires 108a and 108b, respectively. The wire 108a through which a main current flows is constituted of a thick wire. The main portion on the heat sink 103 including the semiconductor pellet 107 is coated with an encapsulation resin 109. In this case, the back surface of the heat sink 103 is exposed from the encapsulation resin 109. Also, as shown in FIG. 16, the lead 104a is disposed in a concave portion 109a of the encapsulation resin 109. Therefore, the surface of the encapsulation resin 109 from which the lead 104a coupled with the heat sink 103 comes out is recessed from the surface of the encapsulation resin 109 from which other leads 104b and 104c come out. Thereby, creepage distances between the lead 104a and the leads 104b and between the lead 104a and 104c can be elongated, and it is possible to assure a safe operation of the semiconductor device at a high voltage.

After encapsulation by the encapsulation resin 109 is completed, unnecessary portions of the first and second band shaped members 101 and 102 of the lead frame 105 which connect the leads 104 are cut and removed. Thereby, the leads 104 are separated and the semiconductor device shown in FIG. 16 is completed.

Also, the center lead 104a is cut within the concave portion 109a of the encapsulation resin 109. Each of the leads 104b and 104c is bent into a crank shape near the encapsulation resin 109. Thereby, end portions of the leads 104b and 104c are made coplanar with the exposed surface of the heat sink 103. FIG. 17 is a side cross sectional view showing a conventional surface mount type power semiconductor device which is manufactured in this way. In the semiconductor device shown in FIG. 17, it is possible to directly solder the heat sink 103 and the leads 104b and 104c to conductive islands of a wiring substrate not shown in the drawing. Therefore, it is possible to lower the height of the semiconductor device mounted on the wiring substrate. Semiconductor devices of this type are disclosed, for example, in Japanese utility model laid-open publication No. 62-188149, Japanese patent laid-open publication No. 4-340264, Japanese patent laid-open publication No. 5-283574 and the like.

In the above-mentioned conventional semiconductor device, it is possible to lower the height thereof. However, since the leads 104b and 104c protrude from the encapsulation resin 109, it is impossible to sufficiently reduce the mounting area of the semiconductor device.

FIG. 18 is a side cross sectional view illustrating another conventional surface mount type power semiconductor device which can obviate the above-mentioned disadvantage. FIG. 19 is a bottom view of the semiconductor device of FIG. 18. In FIG. 18 and FIG. 19, like reference numerals are used to designate identical or corresponding parts to those of the conventional semiconductor device of FIG. 17, and detailed description thereof is omitted here. In the semiconductor device shown in FIGS. 18 and 19, portions of leads 104b and 104c near a heat sink 103 are made coplanar with a surface of the heat sink 103. Also, at the bottom surface of the semiconductor device, portions of the leads 104b and 104c together with the heat sink 103 are exposed from an encapsulation resin 109. Leads 104a, 104b and 104c coming out from the encapsulation resin 109 are cut in the proximity of the encapsulation resin 109. By using this structure, it is possible to further downsize the semiconductor device.

In the semiconductor device having the structure shown in FIG. 18, the area of the heat sink 103 is made as large as possible so that good heat dissipating ability can be obtained. However, in this semiconductor device, it is necessary that the leads 104b and 104c are disposed apart from the lead 104a. Therefore, the areas of electrode portions of the leads 104b and 104c exposed from the encapsulation resin 109 at the bottom surface of the semiconductor device must be relatively small with respect to the exposed area of the heat sink 103.

When the semiconductor device having this structure is soldered on conductive land portions of a wiring substrate, the semiconductor device floats on melted solders and becomes unstable. Therefore, there was a possibility that the semiconductor device rotates or moves from a predetermined mounting location of the semiconductor device.

Further, the heat sink 103 and the leads 104b and 104c are disposed coplanar with each other. Therefore, when the thickness of the heat sink 103 is made larger than that of the leads 104b and 104c to obtain good heat dissipating ability, the difference of height between a semiconductor pellet 107 and the leads 104b and 104c becomes large.

The outer size of the heat sink 103 is reduced as small as possible to downsize the semiconductor device. On the other hand, the outer size of the semiconductor pellet 107 is determined from operating characteristics such as an operating current, an operating power and the like, and reduction of the outer size of the semiconductor pellet 107 is limited. Therefore, the outer sizes of the heat sink 103 and the semiconductor pellet 107 become close to each other. As a result thereof, it is impossible to keep an enough distance from an outside edge portion of the semiconductor pellet 107 to an outside edge portion of the heat sink 103.

Further, in the power semiconductor device, a main current flows from the heat sink 103 through the semiconductor pellet 107 to a surface electrode of the semiconductor pellet 107, and then reaches the lead 104b via the wire 108a. The current passed through the semiconductor pellet 107 reaches the wire 108a via the thin surface electrode of the semiconductor pellet 107. Therefore, if the wire 108a is connected to a peripheral portion of the electrode, on-resistance of the semiconductor device becomes large and an operation at high current is restrained. In order to avoid such restraint, as the wire 108a, a plurality of separate wires are used to parallel couple between the electrode of the semiconductor pellet 107 and the lead 104b.

Therefore, it is impossible to couple the surface electrode of the semiconductor pellet 107 and the lead 104b by using the wire 108a via the shortest distance. There is a possibility that a middle portion of the wire 108a bends and approaches a peripheral corner portion of the semiconductor pellet 107. This deteriorates withstand voltage characteristics of the semiconductor device, and at worst causes short circuit between the wire 108a and the semiconductor pellet 107.

In the conventional lead frame 105, the lead 104a which supports the heat sink 103 at one end thereof has a relatively long portion from the heat sink 103 to the first band shaped member 101. Therefore, the lead 104a bends easily during a manufacturing process of the semiconductor device. Especially, when the thickness of the heat sink 103 is large, there is a possibility that the lead 104a bends and deforms at its middle portion due to the weight of the heat sink 103.

In order to avoid such disadvantage, it may be possible to enlarge the width of the lead 104a to increase the strength of the lead 104a. When the width of the lead 104a is enlarged, however, the spaces between the lead 104a and other leads 104b and 104c as electrodes become short and withstand voltage characteristics of the semiconductor device are deteriorated. Further, the width of the lead 104a cannot be sufficiently large because of the restriction of the width of the electrode portion.

Further, it may be possible to use a conductor tape having a relatively large width in place of the wire 108a and to realize a low on-resistance thereby. However, in such case, when the thickness of the encapsulation resin 109 is decreased to thin down the semiconductor device, it becomes impossible to completely fill the electrode portion with the resin because the conductor tape becomes a hindrance. Thus, voids are formed in the encapsulation resin 109. Even if such voids do not appear at the outside surface of the encapsulation resin 109, a substantial thickness of the encapsulation resin 109 becomes small. This deteriorates moisture resistance of the semiconductor device and deteriorates bonding strength between the electrode portion and the encapsulation resin 109. Therefore, reliability of the semiconductor device is greatly deteriorated.

SUMMARY OF THE INVENTION

Therefore, it is an object of the present invention to provide a surface mount type semiconductor device and a lead frame used for manufacturing the same in which the abovementioned disadvantages of the conventional technology can be obviated.

It is another object of the present invention to provide a surface mount type semiconductor device and a lead frame used for manufacturing the same in which downsizing of the semiconductor device can be attained without deteriorating reliability.

It is still another object of the present invention to provide a surface mount type semiconductor device which can be mounted precisely on a predetermined location of a wiring substrate, and a lead frame used for manufacturing such semiconductor device.

It is still another object of the present invention to provide a surface mount type semiconductor device which has an improved withstand voltage, and a lead frame used for manufacturing such semiconductor device.

It is still another object of the present invention to provide a surface mount type semiconductor device which has an improved moisture resistance, and a lead frame used for manufacturing such semiconductor device.

According to an aspect of the present invention, there is provided a lead frame used for manufacturing semiconductor devices, the lead frame comprising: first and second band shaped members disposed parallel to each other; a plurality of island portions for mounting semiconductor pellets thereon respectively, wherein the plurality of island portions are disposed at predetermined intervals between the first and second band shaped members, and wherein a first end portion of each of the island portions is connected to the first band shaped member; a coupling strip provided for each of the island portions, wherein the coupling strip is disposed between each of the island portions and the second band shaped member, wherein a first end portion of the coupling strip is connected to a second end portion of each of the island portions, and wherein a second end portion of the coupling strip is connected to the second band shaped member; and at least one electrode portion which is provided for each of the island portions and which is to be electrically coupled with a corresponding electrode of the semiconductor pellet mounted on each of the island portions, wherein the at least one electrode portion is disposed between each of the island portions and the second band shaped member, wherein a first end portion of the at least one electrode portion is connected to the second band shaped member, and wherein a second end portion of the at least one electrode portion is opposed to the second end portion of each of the island portions but is not connected to the second end portion of each of the island portions.

In this case, it is preferable that the width of the coupling strip is smallest at the first end portion and becomes gradually larger toward the second end portion, and wherein the width of the at least one electrode portion is larger than the width of the coupling strip.

It is also preferable that the at least one electrode portion comprises two electrode portions corresponding to each of the island portions, the first end portions of the two electrode portions are connected to the second band shaped member on both sides of the coupling strip.

It is further preferable that the first band shaped member has perforations for transferring the lead frame.

It is advantageous that the width of the second band shaped member is smaller than the width of the first band shaped member.

According to another aspect of the present invention, there is provided a lead frame used for manufacturing semiconductor devices, the lead frame comprising: first and second half frame structure portions; and a plurality of bridge members for connecting the first and second half frame structure portions; wherein each of the first and second half frame structure portions comprises: first and second band shaped members disposed parallel to each other; a plurality of island portions for mounting semiconductor pellets thereon respectively, wherein the plurality of island portions are disposed at predetermined intervals between the first and second band shaped members, and wherein a first end portion of each of the island portions is connected to the first band shaped member; a coupling strip provided for each of the island portions, wherein the coupling strip is disposed between each of the island portions and the second band shaped member, wherein a first end portion of the coupling strip is connected to a second end portion of each of the island portions, and wherein a second end portion of the coupling strip is connected to the second band shaped member; and at least one electrode portion which is provided for each of the island portions and which is to be electrically coupled with a corresponding electrode of the semiconductor pellet mounted on each of the island portions, wherein the at least one electrode portion is disposed between each of the island portions and the second band shaped member, wherein a first end portion of the at least one electrode portion is connected to the second band shaped member, and wherein a second end portion of the at least one electrode portion is opposed to the second end portion of each of the island portions but is not connected to the second end portion of each of the island portions; and wherein the first and second half frame structure portions are disposed symmetrically such that the second band shaped members are located inside, and wherein the bridge members are connected to the second band shaped member of the first half frame structure portion and to the second band shaped member of the second half frame structure portion, thereby connecting the second band shaped members of the first and second half frame structure portions together.

It is preferable that each of the bridge members has a perforation for transferring the lead frame.

It is also preferable that, in each of the half frame structure portions, there are provided two electrode portions corresponding to each of the island portions, the first end portions of the two electrode portions are connected to the second band shaped member on both sides of the coupling strip.

It is further preferable that each of the bridge members is located between the coupling strip of the first half frame structure portion and the coupling strip of the second half frame structure portion, wherein a portion of the second band shaped member of the first half frame structure portion connecting to each of the bridge members does not overlap a portion of the second band shaped member of the first half frame structure portion connecting to the electrode portion, and wherein a portion of the second band shaped member of the second half frame structure portion connecting to each of the bridge members does not overlap a portion of the second band shaped member of the second half frame structure portion connecting to the electrode portion.

It is advantageous that each of the perforations is located between the coupling strip of the first half frame structure portion and the coupling strip of the second half frame structure portion.

It is also advantageous that the width of the coupling strip is smallest at the first end portion and becomes gradually larger toward the second end portion, and wherein the width of the at least one electrode portion is larger than the width of the coupling strip.

It is further advantageous that the width of the second band shaped member is smaller than the width of the first band shaped member.

According to still another aspect of the present invention, there is provided a surface mount type semiconductor device comprising: a conductive island portion; a semiconductor pellet mounted on the top surface of the conductive island portion, the semiconductor pellet having at least one electrode formed on the semiconductor pellet; a conductive strip portion, one end of which connects to a portion of a first end portion of the conductive island portion; at least one electrode portion which is electrically coupled with corresponding one of the at least one electrode of the semiconductor pellet, each of the at least one electrode portion does not connect to the conductive island portion; and an encapsulation resin which covers and unifies the semiconductor pellet, the electrode portion, the conductive island portion and the conductive strip portion; wherein, at the bottom surface of the semiconductor device, the bottom surface of the conductive island portion and a portion of the bottom surface of each of the at least one electrode portion are exposed from the encapsulation resin; wherein the portion of the bottom surface of each of the at least one electrode portion exposed from the encapsulation resin and the bottom surface of the conductive island portion are coplanar with each other; wherein, at a side surface of the encapsulation resin, a first end portion of each of the at least one electrode portion and a second end portion of the conductive strip portion are exposed from the encapsulation resin; wherein the width of each of the at least one electrode portion is larger than the width of the conductive strip portion; and wherein a second end portion of each of the at least one electrode portion is raised from the exposed surface of each of the at least one electrode and is located inside the encapsulation resin.

In this case, it is preferable that the conductive island portion functions as a heat sink.

It is also preferable that the at least one electrode portion comprises a plurality of electrode portions.

It is further preferable that the at least one electrode portion comprises two electrode portions.

It is advantageous that the encapsulation resin has a concave portion formed in a side surface of the encapsulation resin, a second end portion of the conductive strip portion protrudes from the concave portion, and first end portions of the two electrode portions protrude from both side of the concave portion in the side surface of the encapsulation resin.

It is also advantageous that the at least one electrode is electrically coupled with the at least one electrode on the semiconductor pellet by wire bonding.

It is further advantageous that, among the at least one electrode on the semiconductor pellet, an electrode through which a main current is to flow is electrically coupled with a corresponding one of the at least one electrode portion via a conductive tape.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, an explanation will be made on a lead frame according to an embodiment of the present invention, and a surface mount type semiconductor device manufactured by using the lead frame.

Figure 1:
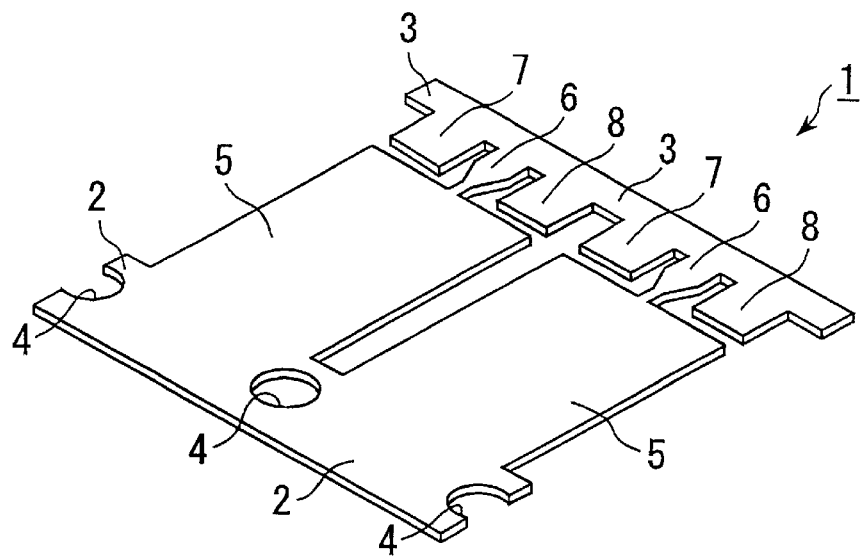
FIG. 1 is a partial perspective view illustrating a major portion of a lead frame according to the first embodiment of the present invention.

FIG. 1 is a partial perspective view illustrating a major portion of the lead frame according to the first embodiment.

The lead frame 1 shown in FIG. 1 comprises a first band shaped member 2 and a second band shaped member 3 disposed parallel to each other. The width of the second band shaped member 3 is smaller than the width of the first band shaped member 2. The first band shaped member 2 has perforations 4 for transferring the lead frame 1. The perforations 4 are formed at intervals of a predetermined distance.

The lead frame 1 further comprises island portions or heat sinks 5 disposed between the first band shaped member 2 and the second band shaped member 3. The heat sinks 5 are disposed with predetermined spaces therebetween. One end of each heat sink 5 is coupled with the first band shaped member 2. A portion of the other end of each heat sink 5 is coupled with the second band shaped member 3 via a coupling strip 6. The thickness of the heat sinks 5 is substantially the same as that of the first and second band shaped members 2 and 3. The width of the coupling strip 6 is smallest at a portion where the coupling strip 6 connects to the heat sink 5, and becomes gradually larger toward the second band shaped member 3.

The lead frame 1 further comprises first and second electrode portions 7 and 8 which connect with the second band shaped member 3 on both sides of the coupling strip 6 and which extend toward the heat sink 5. End portions of the first electrode portion 7 and the second electrode portion 8 do not contact or reach the heat sink 5. The width of each of the first electrode portion 7 and the second electrode portion 8 is larger than that of the coupling strip 6.

The lower surfaces of the first and second band shaped members 2 and 3, the heat sink 5, the coupling strip 6, and the first and second electrode portions 7 and 8 are located coplanar.

The lead frame 1 according to the present embodiment has a structure obtained by repeating the portion illustrated in FIG. 1.

Figure 2:
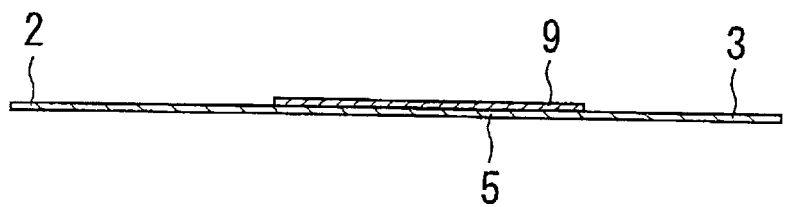
FIG. 2 is a schematic cross sectional view showing a condition of a semiconductor device according to the present invention during manufacture thereof by using the lead frame of FIG. 1.
Figure 3:
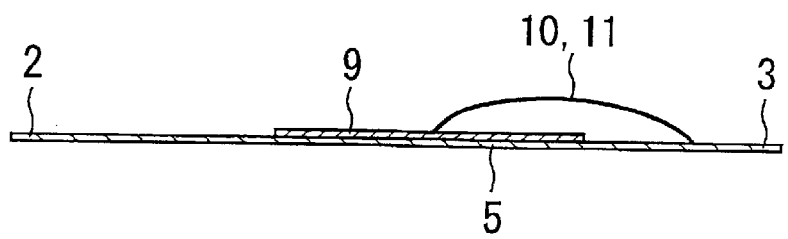
FIG. 3 is a schematic cross sectional view showing a condition of the semiconductor device during manufacture thereof after the condition of FIG. 2.
Figure 4:
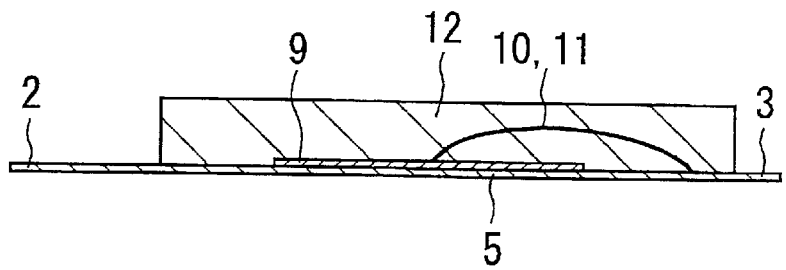
FIG. 4 is a schematic cross sectional view showing a condition of a semiconductor device during manufacture thereof after the condition of FIG. 3.

Next, with reference to the drawings, an explanation will be made on a method of manufacturing a semiconductor device by using the above-mentioned lead frame 1. FIGS. 2–4 are schematic cross sectional views showing a method of manufacturing a semiconductor device in order of process steps.

First, the lead frame 1 having the above-mentioned structure is prepared. The lead frame 1 is supported and guided at the first band shaped member 2 and the second band shaped member 3, and applied to a mounting process. As shown in FIG. 2, a semiconductor pellet 9 is mounted on each of the heat sinks 5 via adhesive, for example, solder, not shown in the drawing.

Then the lead frame 1 is applied to a wire bonding process. As shown in FIG. 3, electrodes not shown in the drawing on each of the semiconductor pellet 9 are electrically coupled with the first electrode portion 7 and the second electrode portion 8 via wires 10 and 11, respectively.

The lead frame 1 is then applied to a resin molding process. As shown in FIG. 4, each group including the first and second electrode portions 7 and 8, the semiconductor pellet 9, and the wires 10 and 11 is molded by an encapsulation resin 12.

Figure 5:
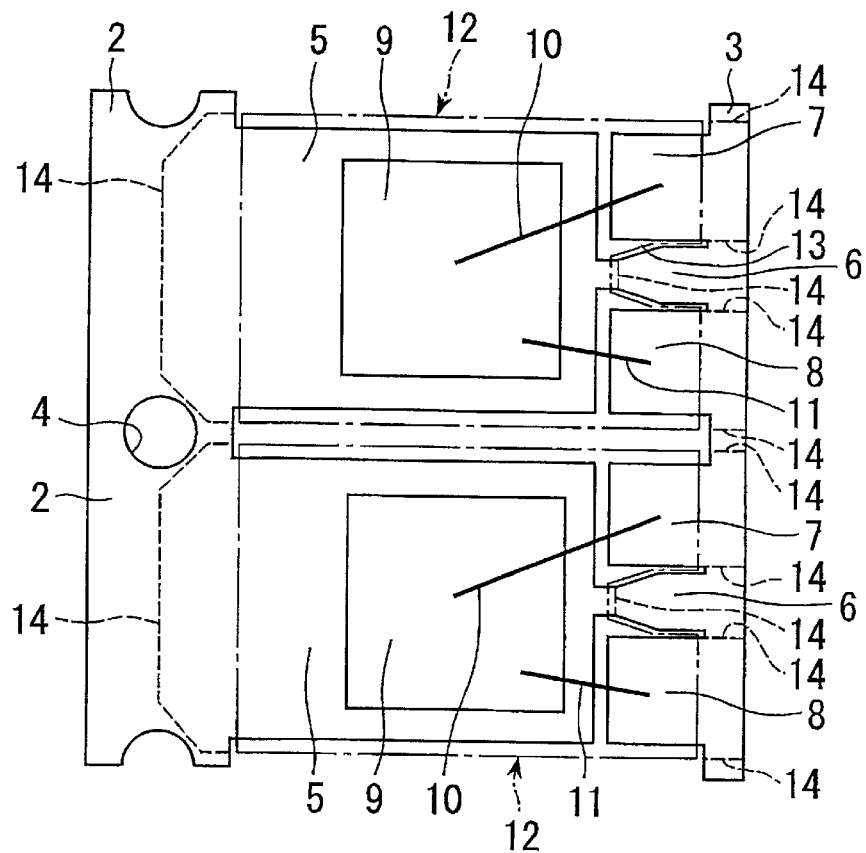
FIG. 5 is a schematic partial perspective plan view showing the lead frame of FIG. 1 after forming an encapsulation resin.

FIG. 5 is a schematic partial perspective plan view showing the lead frame 1 after forming the encapsulation resin 12 in each of the above-mentioned groups. An area encircled by a chain line in FIG. 5 corresponds to an area where the encapsulation resin 12 is formed. Also, in FIG. 5, the structure under the encapsulation resin 12 is perspectively shown. The encapsulation resin 12 has a recessed portion or a concave portion 13 such that a portion of the coupling strip 6 near the heat sink 5 is covered by the encapsulation resin 12 and other portion of the coupling strip 6 is exposed.

Thereafter, the lead frame 1 is cut at locations shown by dotted lines 14 of FIG. 5. That is, the first band shaped member 2, the second band shaped member 3, and the coupling strip 6 are cut at the locations shown by the dotted lines 14. Thereby, the lead frame 1 is separated into individual semiconductor devices 30.

Figure 6:
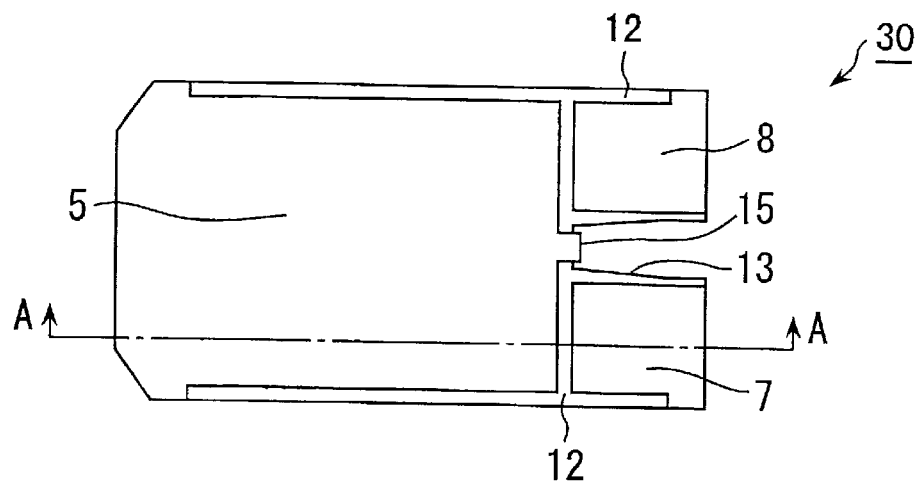
FIG. 6 is a bottom view showing a semiconductor device fabricated by using the lead frame of FIG. 1.

FIG. 6 is a bottom view showing the semiconductor device 30 fabricated in this way. In the semiconductor device 30 shown in FIG. 6, the exposed bottom surface of the heat sink 5 and the exposed bottom surfaces of the first and second electrode portions 7 and 8 are coplanar with each other. Therefore, the semiconductor device 30 can be appropriately surface mounted on a wiring substrate and the like not shown in the drawing. Also, at the concave portion 13 of the encapsulation resin 12, a remaining portion of the coupling strip 6 protrudes from the encapsulation resin 12 and forms a remaining protrusion 15.

Generally, when a semiconductor device is to be mounted on a wiring substrate, there is a possibility that a heat sink of the semiconductor device floating on a melted solder rotates on the solder. However, according to the present embodiment, it is possible, at the bottom surface of the semiconductor device 30, to make each area of the exposed portions of the first and second electrode portions 7 and 8 relatively large with respect to the area of the exposed portion of the heat sink 5. Therefore, the first and second electrode portions 7 and 8 which are located apart from the heat sink 5 operate to suppress rotation of the semiconductor device 30. Thus, it is possible to prevent the semiconductor device 30 from shifting from the location to be mounted. That is, the semiconductor device 30 can be mounted on a predetermined location on the wiring substrate precisely.

In the above-mentioned embodiment, the width of the coupling strip 6 can be smallest at the portion where the coupling strip 6 connects to the heat sink 5, and the width of the coupling strip 6 at a portion connecting to the second band shaped member 3 can be relatively large. Therefore, it is possible to make the portion of the coupling strip 6 having a small width very short, so that deformation of the lead frame 1 can be avoided. Also, since the encapsulation resin 12 has the concave portion 13, it is possible to sufficiently separate the remaining protrusion 15 protruding from the encapsulation resin 12 from the first and second electrode portions 7 and 8. To this end, it is possible to make the distances between the remaining protrusion 15 and the first electrode portion 7 and between the remaining protrusion 15 and the second electrode portion 8 sufficiently large, that is, it is possible to keep the creepage distances therebetween sufficiently large. As a result thereof, it is possible to obtain a large withstand voltage of the semiconductor device.

Figure 7:
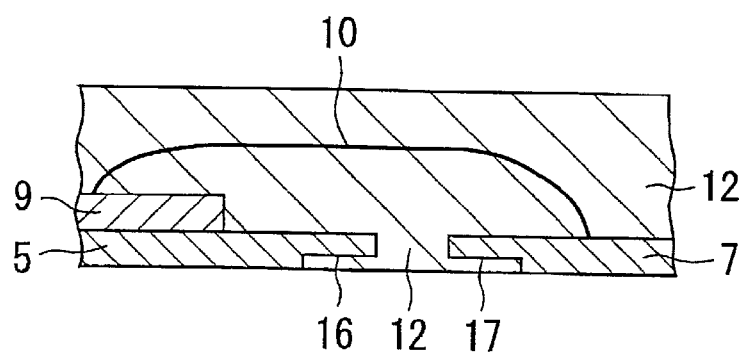
FIG. 7 is a schematic partial cross sectional view of the semiconductor device of FIG. 6, shown as a cross sectional view taken along the line A—A of FIG. 6.

FIG. 7 is a schematic partial cross sectional view of the semiconductor device 30, taken along the line A—A of FIG. 6. Preferably, in the present embodiment, there is provided a stepped portion 16 and/or 17 at: (a) the end portion of the heat sink 5 on the side facing the first and second electrode portions 7 and 8 and; (b) the second end portions of the first and second electrode portions 7 and 8, i.e., the end facing the heat sink 5. The stepped portion(s) 16 or 17 can be formed when manufacturing the lead frame 1.

In general, if the space between the heat sink 5 and the first and second electrode portions 7 and 8 is too small, the following problem may occur: in a surface mounting process of a semiconductor device, there is a possibility that liquefied solder may cause a short circuit: (a) between the heat sink 5 and the first electrode portion 7; and/or (b) between the heat sink 5 and the second electrode portion 8. To prevent such short circuit possibilities, the stepped portions 16 or 17 increase the creepage distance between the heat sink 5 and the first and second electrode portions 7 and 8 which are exposed from the encapsulation resin 12 at the bottom surface of the semiconductor device.

The stepped portions 16 and 17 enable the withstand voltage of the semiconductor device to be sufficiently high. In addition, it is possible to avoid a short circuit created by solder between the heat sink 5 and the first and second electrode portions 7 and 8 when surface mounting the semiconductor device. Further, by providing the stepped portions 16 and/or 17, it is possible to improve adhesion: (a) between the heat sink 5 and the encapsulation resin 12; and (b) between the first and second electrode portions 7 and 8 and the encapsulation resin 12. Thus, moisture resistance of the semiconductor device can be improved.

Also, in the present embodiment, the width of the cutting portion of the coupling strip 6 is relatively small. Therefore, when cutting the coupling strip 6, undesirous excess external force is not applied to the encapsulation resin 12. Thus, it is possible to cut the coupling strip 6 without causing a crack in the encapsulation resin 12 adjacent to the coupling strip 6.

Figure 8:
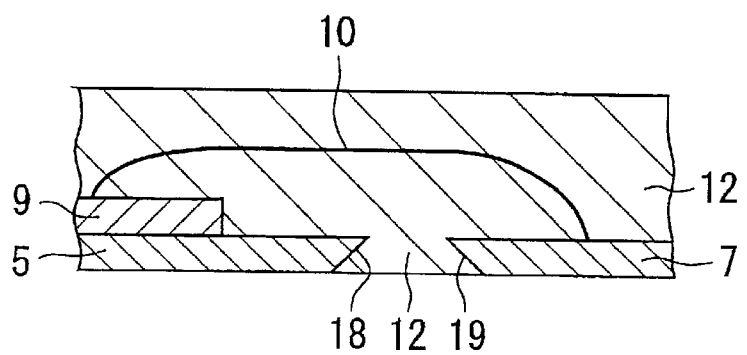
FIG. 8 is a schematic partial cross sectional view of another semiconductor device, shown as a cross sectional view taken along the line A—A of FIG. 6.

FIG. 8 is a partial enlarged cross sectional view showing a semiconductor device according to another embodiment of the present invention, and corresponds to FIG. 7. In the semiconductor device of FIG. 8, there is provided a slant surface 18 or 19 at least at one of the end portion of the heat sink 5 and the end portions of the first and second electrode portions 7 and 8, in place of the stepped portions 16 or 17 of FIG. 7. Other structure of the semiconductor device of FIG. 8 is the same as that of the semiconductor device of FIG. 7, and detailed explanation thereof is omitted here. In the semiconductor device having the slant surface 18 or 19 as shown in FIG. 8, it is possible to obtain advantageous effect similar to that obtained by providing the stepped portion 16 or 17 as shown in FIG. 7.

Figure 9:
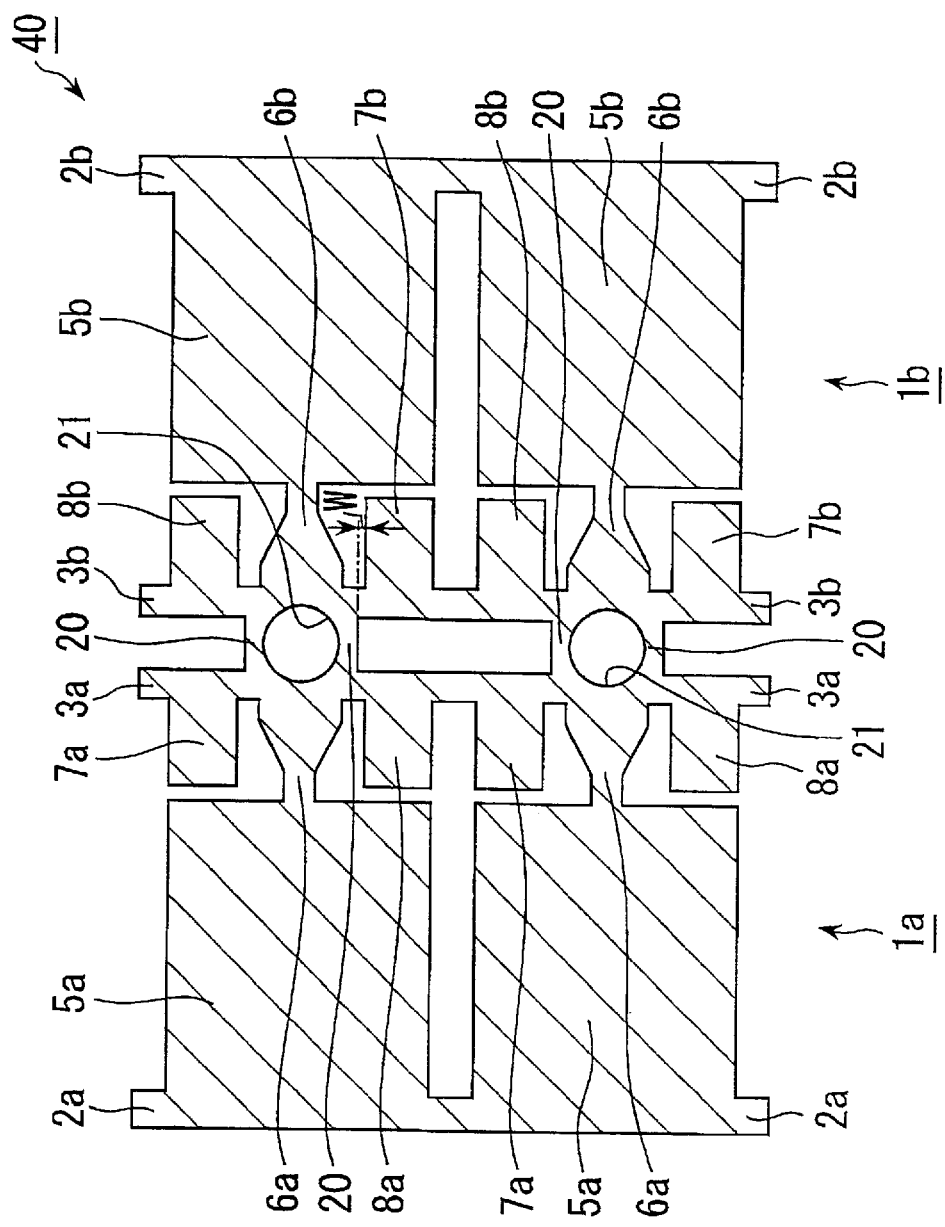
FIG. 9 is a partial plan view schematically showing a lead frame according to the second embodiment of the present invention.

FIG. 9 is a partial plan view schematically showing a lead frame according to the second embodiment of the present invention. The lead frame 40 shown in FIG. 9 has a structure in which half frame structure portions 1a and 1b each corresponding to the lead frame 1 shown in FIG. 1 are unified into one frame member. That is, the structure of the lead frame 40 corresponds substantially to a structure in which the half frame structure portions 1a and 1b are symmetrically opposed such that second band shaped members 3a and 3b are disposed inside and in which the second band shaped members 3a and 3b opposing to each other are coupled together via bridge members 20. Therefore, the lead frame 40 comprises: first band shaped members 2a and 2b each corresponding to the first band shaped member 2 of the lead frame 1 of the first embodiment; second band shaped members 3a and 3b each corresponding to the second band shaped member 3; heat sinks 5a and 5b each corresponding to the heat sink 5; the coupling strips 6a and 6b each corresponding to the coupling strip 6; first electrode portions 7a and 7b each corresponding to the first electrode portion 7; second electrode portions 8a and 8b each corresponding to the second electrode portion 8; and the bridge members 20.

Differing from the lead frame 1 of the first embodiment, the lead frame 40 does not have perforations formed in the first band shaped members 2a and 2b. In the lead frame 40, perforations 21 are formed in the bridge members 20. The shape of each of the perforations 21 is, for example, a circle. The center of each of the perforations 21 is located, for example, on the line which connects the center lines of the coupling strips 6a and 6b.

Each of the bridge members 20 couples: a portion of the second band shaped member 3a located between the first electrode portions 7a and the second electrode portion 8a which oppose via the coupling strip 6a; and a portion of the second band shaped member 3b located between the first electrode portions 7b and the second electrode portion 8b which oppose via the coupling strip 6b. The width of the bridge member 20 including the perforation 21 is smaller than the space between the first electrode portion 7a and the second electrode portion 8a which oppose via the coupling strip 6a. Similarly, the width of the bridge member 20 including the perforation 21 is smaller than the space between the first electrode portion 7b and the second electrode portion 8b which oppose via the coupling strip 6b. Therefore, as shown in FIG. 9, one of the side edge portions of the bridge member 20 is located inside from the line connecting the side edge of the first electrode portion 7a and the side edge of the second electrode portion 8b by a distance W. Also, the other one of the side edge portions of the bridge member 20 is located inside from the line connecting the side edge of the first electrode portion 7b and the side edge of the second electrode portion 8a by the distance W. By this structure, in a cutting process of the lead frame 40 mentioned later, it becomes possible to simultaneously cut and remove the coupling strips 6a and 6b and the bridge members 20.

In the lead frame 40, the width of each of the second band shaped members 3a and 3b is smaller than the width of each of the first band shaped members 2a and 2b. Thereby, it becomes possible to reduce the total width of the lead frame 40. Also, in the cutting process of the lead frame 40 mentioned later, quantity of portions which are cut and scrapped can be reduced.

Also, the width of the first band shaped member 2a and the width of the first band shaped member 2b are made as small as possible. Thereby, in the cutting process of the lead frame 40 mentioned later, it is possible to easily cut the first and second band shaped members 2a and 2b.

The lead frame 40 according to the second embodiment has a structure obtained by repeating the portion illustrated in FIG. 9, toward upside and downside of FIG. 9.

Next, an explanation will be made on a method of manufacturing a semiconductor device by using the above-mentioned lead frame 40. In this embodiment, a semiconductor device can be fabricated similarly to the semiconductor device of FIG. 6 and FIG. 7, by using the lead frame 40 of FIG. 9.

First, the lead frame 40 having the above-mentioned structure is prepared. The lead frame 40 is applied to a mounting process in which semiconductor pellets are mounted thereon. A semiconductor pellet 9a is mounted on each of the heat sinks 5a and a semiconductor pellet 9b is mounted on each of the heat sinks 5b, via adhesive, for example, solder. In this case, the direction of the semiconductor pellets 9a mounted on the heat sinks 5a and the direction of the semiconductor pellet 9b mounted on the heat sink 5b differ from each other by 180 degrees.

Then the lead frame 40 is applied to a wire bonding process. Electrodes not shown in the drawing on each of the semiconductor pellets 9a are electrically coupled with the first electrode portion 7a and the second electrode portion 8a via wires 10a and 11a, respectively. Also, electrodes not shown in the drawing on each of the semiconductor pellets 9b are electrically coupled with the first electrode portion 7b and the second electrode portion 8b via wires 10b and 11b, respectively.

After finishing the wire bonding process, the lead frame 40 is then applied to a resin molding process. Major portions on the lead frame 40 are molded by encapsulation resin 22. That is, each group including the first and second electrode portions 7a and 8a, the semiconductor pellet 9a, and the wires 10a and 11b, and each group including the first and second electrode portions 7b and 8b, the semiconductor pellet 9b, and the wires 10b and 11b are respectively molded by the encapsulation resin 22.

Figure 10:
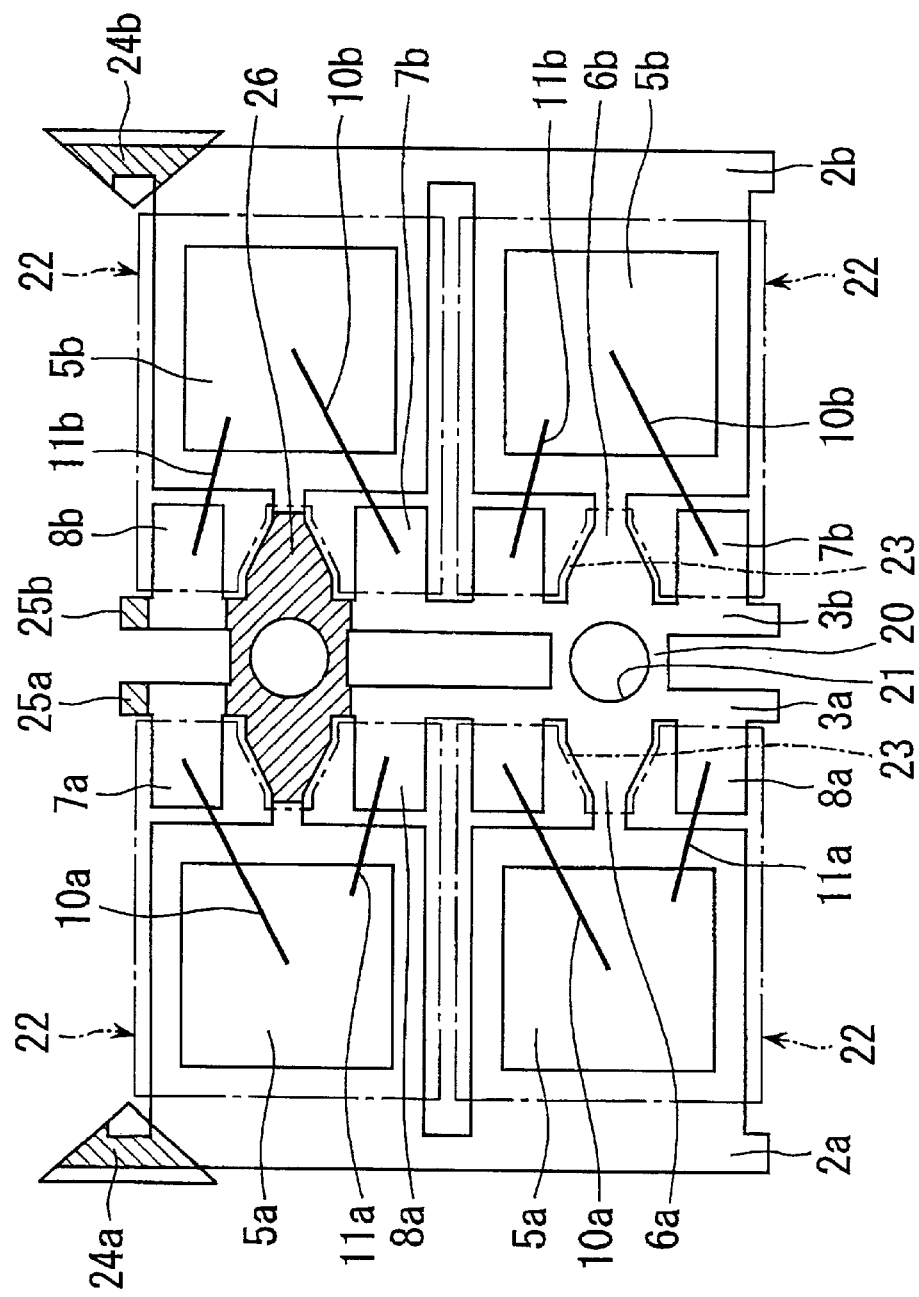
FIG. 10 is a schematic partial perspective plan view showing the lead frame of FIG. 9 after forming an encapsulation resin.

FIG. 10 is a schematic partial perspective plan view showing the lead frame 40 after forming the encapsulation resin 22 in each of the above-mentioned groups. An area encircled by a chain line in FIG. 10 corresponds to an area where the encapsulation resin 22 is formed. Also, in FIG. 10, the structure under the encapsulation resin 22 is perspectively shown. The encapsulation resin 22 has recessed portions or concave portions 23 such that portions of the coupling strips 6a and 6b near the heat sinks 5a and 5b are covered by the encapsulation resin 22 and other portions of the coupling strips 6a and 6b are exposed. The first band shaped members 2a and 2b are exposed.

Thereafter, the lead frame 40 molded by the encapsulation resin 22 is applied to a cutting process. In the cutting process, the lead frame 40 is intermittently transferred, and portions 24a, 24b, 25a, 25b and 26 shown in FIG. 10 by hatching are cut and removed sequentially by using cutting punches and the like, as follows.

That is, a connecting portion 24a of the first band shaped member 2a located between the heat sinks 5a and a connecting portion 24b of the first band shaped member 2b located between the heat sinks 5b are cut by using cutting punches each having approximately V shape, and are removed. Thereby, corner portions of the heat sinks 5a and 5b are cut away, and the corner portions are shaped into corners having obtuse angles. In this case, since the width of each of the connecting portions 24a and 24d is relatively small, it is possible to easily cut these portions.

Further, a portion 25a of the second band shaped member 3a between the first and second electrode portions 7a and 8a which oppose to each other without interposing the coupling strip 6a therebetween, and a portion 25b of the second band shaped member 3b between the first and second electrode portions 7b and 8b which oppose to each other without interposing the coupling strip 6b therebetween are cut and removed.

Then, a portion 26 which includes exposed portions of the coupling strips 6a and 6b, the bridge portions 20 and portions of the second band shaped members 3a and 3b connecting to the bridge portions 20 are cut and removed.

Thereby, the first electrode portion 7a and the second electrode portion 8b located at the head of the lead frame 40 are separated from the second band shaped members 3a and 3b.

Thereafter, the lead frame 40 is transferred by one pitch by using the perforations 21. Then, portions which correspond to the connecting portions 24a and 24b and to the portions 25a and 25b and which are not shown in FIG. 10 by hatching are sequentially or simultaneously cut and removed. Thereby, the heat sink 5a and the second electrode portion 8a located at the head of the lead frame 40 are separated from the first and second band shaped members 2a and 3a, and the heat sink 5b and the first electrode portion 7b located at the head of the lead frame 40 are separated from the first and second band shaped members 2b and 3b. Therefore, two semiconductor devices 50 having the semiconductor pellets 9a and 9b respectively and having the same structure are separated.

Figure 11:
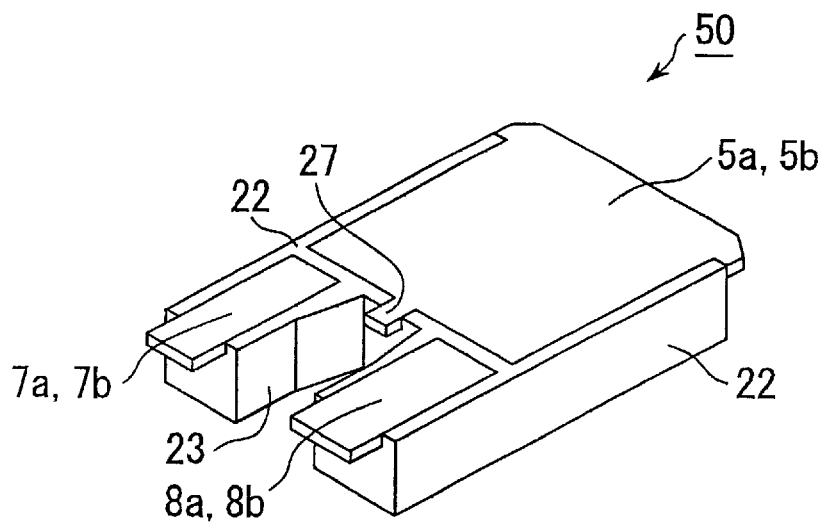
FIG. 11 is a perspective view showing a semiconductor device fabricated by using the lead frame of FIG. 9.

FIG. 11 is a perspective view showing the semiconductor device 50 fabricated in this way as viewed from the bottom side thereof. The semiconductor device 50 has substantially similar structure to that of the semiconductor device 30 mentioned above, and has substantially the same advantageous effects as those of the semiconductor device 30.

In the lead frame 40 mentioned above, the width of the second band shaped members 3a and 3b can be very small. Also, portions of the second band shaped members 3a and 3b can be used as portions of the first and second electrode portions 7a, 7b, 8a and 8b. That is, after finishing the cutting process of the lead frame mentioned above, remaining portions of the second band shaped members 3a and 3b can be utilized as portions of the first and second electrode portions 7a, 7b, 8a and 8b. Therefore, it is possible to reduce the total width of the lead frame 40.

Also, the space between the half frame structure portions 1a and 1b can be determined depending on the size or diameter of the perforations 21. Thus, the space between the half frame structure portions 1a and 1b can be considerably small. Therefore, it becomes possible to efficiently fabricate a number of semiconductor devices by using a lead frame having a relatively small size.

In the above-mentioned lead frames 1 and 40, there are provided two electrode portions, that is, the first and second electrode portions, per one heat sink. Thereby, the semiconductor device 30 and 50 each having two electrode portions, that is, the first and second electrode portions, can be fabricated. However, in the present invention, the number of electrode portions is not limited to that of the above-mentioned embodiments. The number of the electrode portions can be one, three or more, per one heat sink or semiconductor device.

In the semiconductor device 50, it is possible to provide a stepped portion or a slant surface at least at one of opposing end portion of the heat sink and end portions of the first and second electrode portions, in a manner similar to the semiconductor device of FIG. 7 or FIG. 8. Thereby, it is possible to obtain similar effect to that of the semiconductor device of FIG. 7 or FIG. 8. That is, it is possible to increase an withstand voltage and to improve moisture resistance.

Figure 12:
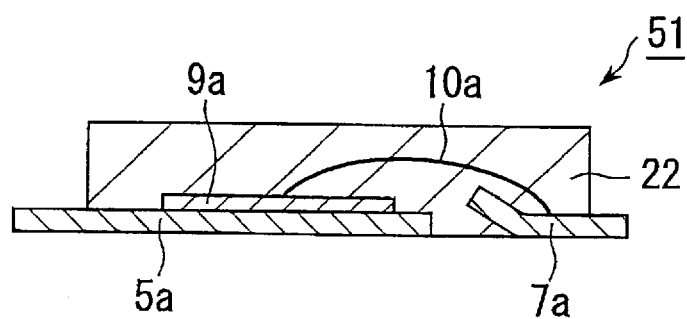
FIG. 12 is a cross sectional view showing a schematic structure of a semiconductor device according to still another embodiment of the present invention.
Figure 13:
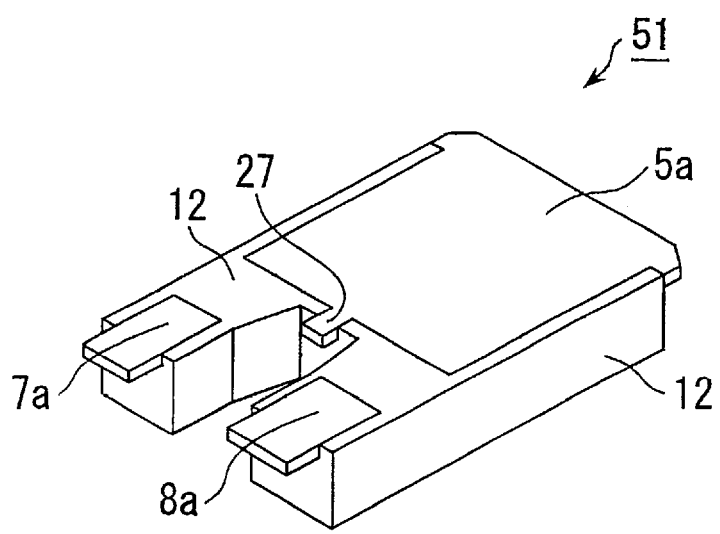
FIG. 13 is a perspective view of the semiconductor device of FIG. 12 as viewed from the bottom side thereof.
Figure 14:
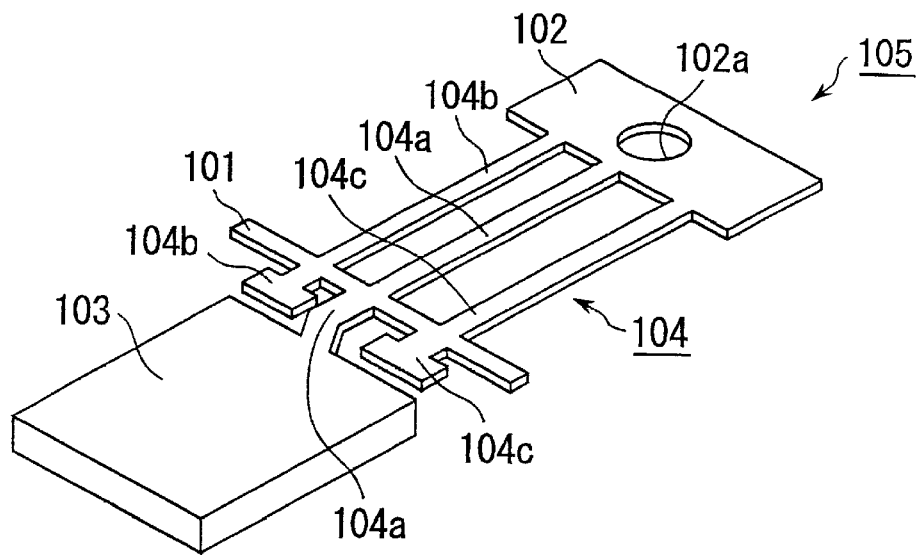
FIG. 14 is a partial perspective view illustrating a conventional lead frame used for fabricating a semiconductor device.
Figure 15:
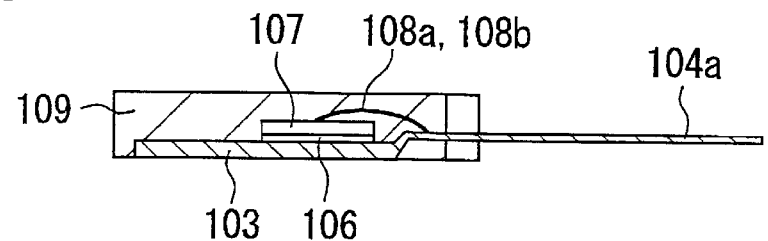
FIG. 15 is a side cross sectional view of a conventional power semiconductor device fabricated by using the lead frame of FIG. 14.
Figure 16:
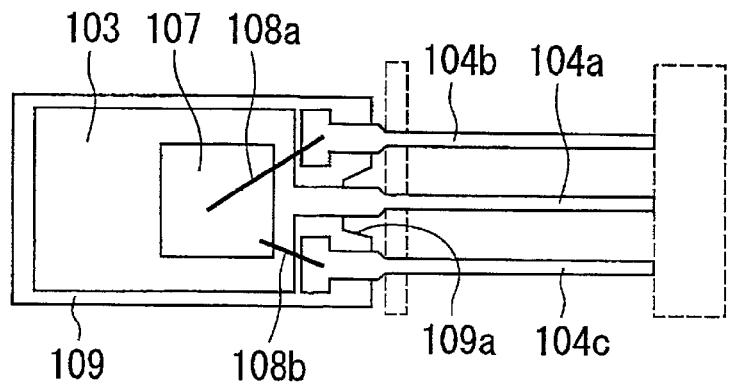
FIG. 16 is a top perspective view of the semiconductor device of FIG. 15.
Figure 17:
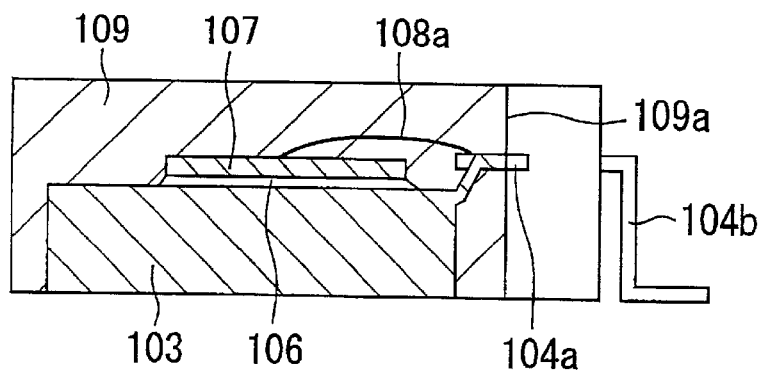
FIG. 17 is a side cross sectional view showing a conventional surface mount type power semiconductor device fabricated by using the lead frame of FIG. 14.
Figure 18:
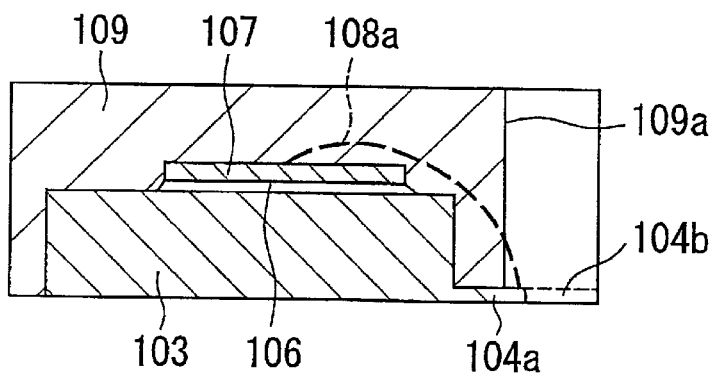
FIG. 18 is a side cross sectional view illustrating another example of a conventional surface mount type power semiconductor device.
Figure 19:
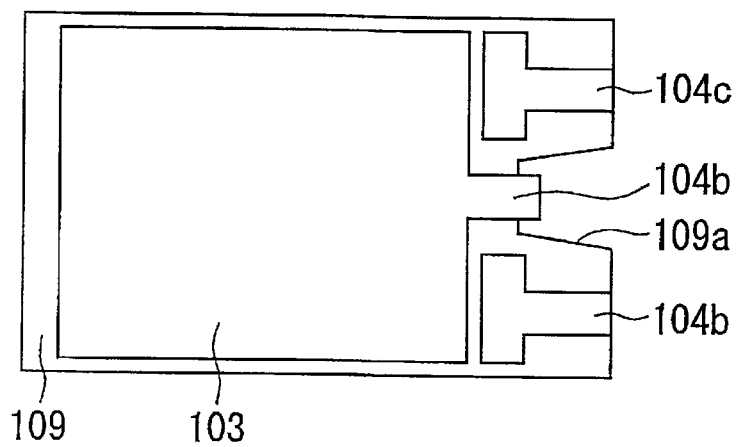
FIG. 19 is a bottom view of the semiconductor device of FIG. 18.

FIG. 12 is a cross sectional view showing a schematic structure of a semiconductor device according to still another embodiment of the present invention. FIG. 13 is a perspective view of the semiconductor device of FIG. 12 from the bottom side thereof.

In the semiconductor device 51 shown in FIG. 12 and FIG. 13, an end portion of the first electrode portion 7a and an end portion of the second electrode portion 8a which are opposed to the heat sink 5a are raised from the exposed surface of the heat sink 5a. As a result thereof, the raised end potions of the first electrode portion 7a and the second electrode portion 8a are located inside the encapsulation resin 22. The other structure of the semiconductor device 51 is substantially the same as the above-mentioned semiconductor device 50, and detailed explanation thereof is omitted here.

In FIG. 12 and FIG. 13, like reference numerals are used to designate identical parts to those of the semiconductor device 50. Also, in the description concerning the semiconductor device 51 of FIG. 2 and FIG. 13, it is possible to replace the heat sink 5a, the first electrode portion 7a, the second electrode portion 8a, the semiconductor pellet 9a and the wires 10a and 11b, with the heat sink 5b, the first electrode portion 7b, the second electrode portion 8b, the semiconductor pellet 9b and the wires 10b and 11b, respectively.

The semiconductor device 51 can be fabricated by a method substantially similar to the method of manufacturing the semiconductor device 50 mentioned above, except that the end portions of the first electrode portions 7a and 7b and the end portions of the second electrode portions 8a and 8b are bent or raised from the exposed surfaces of the heat sinks 5a and 5b. Therefore, an explanation of the method of manufacturing the semiconductor device 51 is omitted here.

The semiconductor device 51 has the same effects as those mentioned above with respect to the semiconductor devices 30 and 50. The semiconductor device 51 further has the following effects.

In the semiconductor device 51, the end portion of the first electrode portion 7a and the end portion of the second electrode portion 8a which are opposed to the heat sink 5a are raised from the exposed surface of the heat sink 5a. Therefore, it becomes possible to increase the distance between the heat sink 5a and the first electrode portion 7a exposed at the bottom surface of the semiconductor device 51, and the distance between the heat sink 5a and the second electrode portion 8a exposed at the bottom surface of the semiconductor device 51. Therefore, the withstand voltage of the semiconductor device 51 can be sufficiently large. Also, since the raised end potions of the first electrode portion 7a and the second electrode portion 8a are located inside the encapsulation resin 22, adhesion between the encapsulation resin 22 and the first and second electrode portions 7a and 8a is improved. Thereby, moisture resistance of the semiconductor device is also improved.

Further, even when a middle portion of each of the wires 10a and 11a droops, further fall of each wire is stopped by the raised end portion of each of the first electrode portion 7a and the second electrode portion 8a. Therefore, it is possible to prevent the wires 10a and 11a from contacting or approaching a corner edge portion of the semiconductor pellet 9a. Thus, it becomes possible to appropriately avoid deterioration of an withstand voltage and occurrence of a short circuit in the semiconductor device.

Still further, in the semiconductor device 51, in order to efficiently dissipate heat generated by the semiconductor pellet 9a, it is possible to make the thickness of the heat sink 5a larger than that of each of the first electrode portion 7a and second electrode portion 8a. In such case, difference between the height of electrodes on the semiconductor pellet 9a and the height of wire connecting portions on the first electrode portion 7a and the second electrode portion 8a becomes considerably larger. Therefore, it may be necessary that lengths of the wires 10a and 10b are considerably longer. When the lengths of the wires 10a and 10b are long, a middle portion of each of the wires 10a and 11a may easily droop. This may cause contact or approach between the wires 10a and 11a and a corner edge portion of the semiconductor pellet 9a, so that an withstand voltage may be deteriorated or a short circuit may occur. However, in the semiconductor device 51, even if a middle portion of each of the wires 10a and 11a droops, further fall of each wire is stopped by the raised end portion of each of the first electrode portion 7a and the second electrode portion 8a. Therefore, it is possible to prevent the wires 10a and 11a from contacting or approaching a corner edge portion of the semiconductor pellet 9a. Thus, it becomes possible to appropriately avoid deterioration of an withstand voltage and occurrence of a short circuit in the semiconductor device. Thereby, in the semiconductor device 51, it is possible to increase the thickness of the heat sink 5a and to raise an efficiency of heat dissipation, without causing deterioration of an withstand voltage and occurrence of a short circuit.

In the above-mentioned semiconductor devices 30, 50 and 51, electrodes of the semiconductor pellet 9, 9a and 9b and the first and second electrode portions 7, 7a, 7b and 8, 8a, 8b are electrically coupled by using the wires 10, 10a, 10b, 11, 11a and 11b. However, in place of the wires 10, 10a, 10b, 11, 11a and 11b, it is possible to use conductor tapes each having a relatively large width. Especially, it is preferable that, among the electrodes of the semiconductor pellet, an electrode through which a main current flows is electrically coupled with a corresponding one of the first and second electrode portions via the conductive tape. Thereby, it is possible to realize a low on-resistance.

Generally, when the conductor tapes are used in pace of the wires, there is a possibility that voids are formed in the encapsulation resin and reliability of the semiconductor device is deteriorated. This is because, in a resin molding process, the conductor tapes each having a large width become hindrances to a flow of injected resin material. However, when the lead frame according to the present invention is used, such disadvantage does not occur. The reason for this is as follows.

That is, in the lead frames 1 and 40, the widths of the coupling strips 6, 6a and 6b are considerably small in the proximity of the heat sinks 5, 5a and 5b. Therefore, in the lead frame 1, the space between the coupling strip 6 and the first electrode portion 7 and the space between the coupling strip 6 and the second electrode portion 8 are relatively large. Similarly, in the lead frame 40, the space between the coupling strip 6a and the first electrode portion 7a, the space between the coupling strip 6a and the second electrode portion 8a, the space between the coupling strip 6b and the first electrode portion 7b, and the space between the coupling strip 6b and the second electrode portion 8b are relatively large. Therefore, it is possible to enlarge a cross sectional area of portions through which the resin can flow, in the resin molding process. Thereby, it becomes possible to smoothly inject the resin material into backsides of the conductor tapes. As a result, it is possible to avoid occurrence of voids in the encapsulation resin and to improve reliability of the semiconductor devices.

In summary, according to the present invention, it is possible to easily manufacture a large number of surface mount type semiconductor devices by using a lead frame having a small size. Also, when the semiconductor device according to the present invention are surface mounted on a wiring substrate by using solder and the like, it is possible to precisely mount the semiconductor device on the predetermined location. Further, according to the present invention, it is possible to realize a semiconductor device having an improved withstand voltage and improved moisture resistance.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A lead frame used for manufacturing semiconductor devices, said lead frame comprising:

first and second band shaped members disposed parallel to each other;

a plurality of island portions for mounting semiconductor pellets thereon respectively, wherein said plurality of island portions are disposed at predetermined intervals between said first and second band shaped members, and wherein a first end portion of each of said island portions is connected to said first band shaped member;

a coupling strip provided for each of said island portions, wherein said coupling strip is disposed between each of said island portions and said second band shaped member, wherein a first end portion of said coupling strip is connected to a second end portion of each of said island portions, and wherein a second end portion of said coupling strip is connected to said second band shaped member; and at least one electrode portion which is provided for each of said island portions and which is to be electrically coupled with a corresponding electrode of said semiconductor pellet mounted on each of said island portions, wherein said at least one electrode portion is disposed between each of said island portions and said second band shaped member, wherein a first end portion of said at least one electrode portion is connected to said second band shaped member, and wherein a second end portion of said at least one electrode portion is opposed to said second end portion of each of said island portions but is not connected to said second end portion of each of said island portions, wherein the width of each of said coupling strips is smallest at said first end portion of said coupling strip and becomes gradually larger toward said second end portion of said coupling strip, and wherein the width of each of said at least one electrode portion is larger than the width of each of said coupling strips.

2. A lead frame as set forth in claim 1, wherein each electrode portion comprises a pair of electrode subportions, wherein the electrode subportions in one of said pairs of electrode portions correspond to the same island portion, wherein each electrode subportion comprises a first end and a second end, wherein the first end of a first of said electrode subportions in one of said pairs of electrode portions is connected to said second band shaped member adjacent a first side of said coupling strip, and wherein the first end of the second electrode subportion in the pair of electrode portions is connected to the second band member adjacent a second side of said of said coupling strip, the second side of said coupling strip being opposite the first side of said coupling strip.

3. A lead frame as set forth in claim 1, wherein said first band shaped member has perforations for transferring said lead frame.

4. A lead frame as set forth in claim 1, wherein the width of said second band shaped member is smaller than the width of said first band shaped member.

* * * * *